(12) United States Patent
Ting et al.

(10) Patent No.: US 10,157,752 B2
(45) Date of Patent: *Dec. 18, 2018

(54) SYSTEMS AND METHODS FOR IN SITU MAINTENANCE OF A THIN HARDMASK DURING AN ETCH PROCESS

(71) Applicant: Taiwan Semiconductor Manufacturing Company, Ltd., Hsin-Chu (TW)

(72) Inventors: Chih-Yuan Ting, Taipei (TW); Chung-Wen Wu, Hsinchu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/018,207

(22) Filed: Feb. 8, 2016

(65) Prior Publication Data
US 2016/0155648 A1    Jun. 2, 2016

Related U.S. Application Data

(63) Continuation of application No. 14/229,521, filed on Mar. 28, 2014, now Pat. No. 9,257,298.

(51) Int. Cl.
*H01L 21/311* (2006.01)
*H01L 21/3065* (2006.01)
(Continued)

(52) U.S. Cl.
CPC .... *H01L 21/31144* (2013.01); *H01L 21/0273* (2013.01); *H01L 21/0332* (2013.01);
(Continued)

(58) Field of Classification Search
CPC ......... H01L 21/31144; H01L 21/31116; H01L 21/32135; H01L 21/0273; H01L 21/0332;
(Continued)

(56) References Cited

U.S. PATENT DOCUMENTS 5,935,454 A * 8/1999 Tada ............... B82Y 10/00
216/41
6,387,774 B1 * 5/2002 Yoo ............... H01L 21/0335
257/E21.009
(Continued)

FOREIGN PATENT DOCUMENTS

| TW | 200411771 | 7/2004 |
|----|-----------|--------|
| TW | 201316403 | 4/2013 |
| TW | 201409180 | 3/2014 |

*Primary Examiner* — Kevin M Picardat
(74) *Attorney, Agent, or Firm* — Haynes and Boone, LLP

(57) ABSTRACT

Methods of patterning a target material layer are provided herein. The method includes steps of positioning a semiconductor wafer having the target material layer thereon in an etch chamber and of providing a flow of etch gases into the etch chamber, the flow of etch gases etchant gas comprising a plurality of gases. The semiconductor wafer has a patterned hardmask feature formed from a compound on the target material layer. The method also includes steps of etching the target material layer using the patterned hardmask feature as a mask feature, wherein one of the gases chemically alters the patterned hardmask feature and at least one of the gases chemically repairs the patterned hardmask feature so that the patterned hardmask feature retains its dimensions during the etching. Associated semiconductor wafer are also provided herein.

20 Claims, 8 Drawing Sheets

(51) Int. Cl.
  *H01L 21/308*  (2006.01)
  *H01L 21/033*  (2006.01)
  *H01L 21/3213* (2006.01)
  *H01L 21/027*  (2006.01)

(52) U.S. Cl.
  CPC ...... *H01L 21/0335* (2013.01); *H01L 21/3065* (2013.01); *H01L 21/3085* (2013.01); *H01L 21/31116* (2013.01); *H01L 21/32135* (2013.01); *H01L 21/32136* (2013.01); *H01L 21/32139* (2013.01)

(58) Field of Classification Search
  CPC ............. H01L 21/3081; H01L 21/3085; H01L 21/0335; H01L 21/0337; H01L 21/30604–21/30621; H01L 21/3063–21/30635; H01L 21/3065–21/30655; H01L 21/31055–21/31056; H01L 21/31111–21/31122; H01L 21/31133–21/31138; H01L 21/32133–21/32139
  USPC ........ 438/695, 696, 700, 702, 703, 735, 736
  See application file for complete search history.

(56) References Cited

U.S. PATENT DOCUMENTS

| | | | |
|---|---|---|---|
| 7,785,484 B2* | 8/2010 | Heo | H01L 21/0334 216/41 |
| 9,123,542 B2 | 9/2015 | Murakami et al. | |
| 9,153,455 B2 | 10/2015 | Larsen et al. | |
| 9,257,298 B2* | 2/2016 | Ting | H01L 21/3065 |
| 2004/0072443 A1* | 4/2004 | Huang | H01L 21/31116 438/710 |
| 2006/0205220 A1* | 9/2006 | Hudson | H01L 21/0273 438/694 |
| 2011/0177669 A1* | 7/2011 | Lee | H01J 37/321 438/400 |
| 2013/0236989 A1* | 9/2013 | Ranjan | H01L 21/02063 438/5 |
| 2014/0273470 A1* | 9/2014 | Lin | H01L 21/02175 438/702 |
| 2015/0107769 A1 | 4/2015 | Nakano | |
| 2015/0200096 A1 | 7/2015 | Huang et al. | |

* cited by examiner

SYSTEMS AND METHODS FOR IN SITU MAINTENANCE OF A THIN HARDMASK DURING AN ETCH PROCESS

This is a continuation of U.S. Ser. No. 14/229,521 filed Mar. 28, 2014, the entire disclosure of which is hereby incorporated by reference.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased. As the feature size as decreased, existing fabrication systems and processes have often proven unsatisfactory.

BRIEF DESCRIPTION OF THE DRAWINGS

It is emphasized that, in accordance with the standard practice in the industry, various features are not drawn to scale. In fact, the dimensions of the various features may be arbitrarily increased or reduced for clarity of discussion.

Aspects of the figures in the present disclosure are best understood from the following detailed description as read in connection with the figures.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features are not in direct contact. Various features may be arbitrarily drawn in different scales for the sake of simplicity and clarity.

In semiconductor device fabrication, the pursuit of smaller feature size has required a number of technological changes, including changes in the fabrication processes uses to create features on a semiconductor wafer. To mitigate the difficulties presented by the increasingly small features used as masking layers have decreased, the disclosure presents the use of a particular etch gas mixture that mitigates damage to the small features during the etch process itself.

Figure 1A:
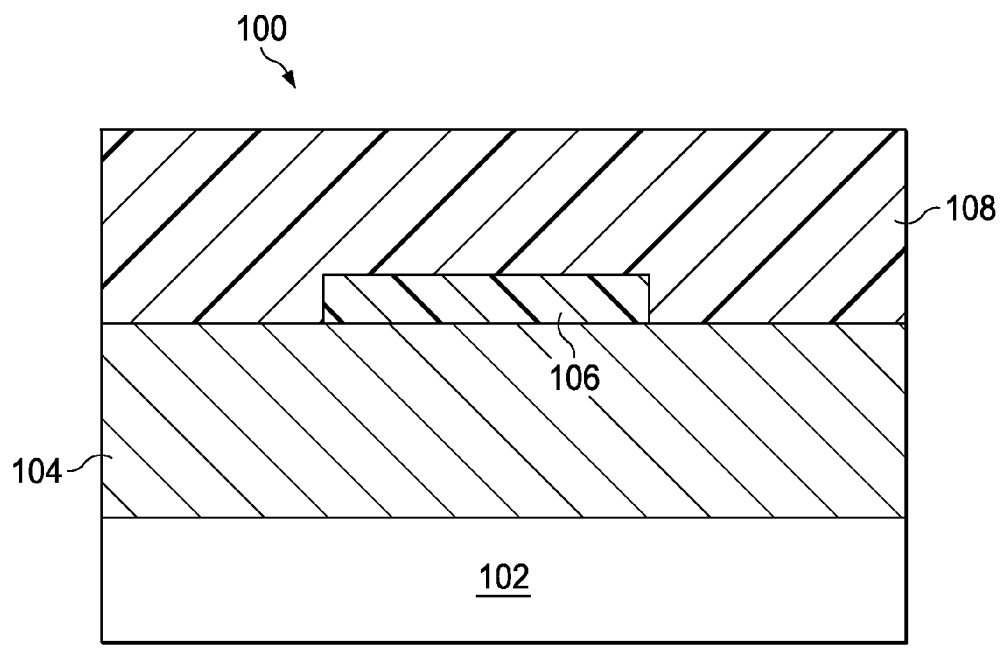
FIGS. 1A and 1B are fragmentary, cross-sectional views of a wafer during processing according to an embodiment.

FIG. 1A illustrates a cross-section of a semiconductor wafer 100 during the fabrication of devices such as transistors, capacitors, resistors, and other semiconductor device elements. Certain process steps are performed to achieve the wafer as seen in FIG. 1A, including depositions and etchings using photolithographically patterned masks. As illustrated in FIG. 1A, the wafer 100 includes a semiconductor substrate 102, which may be one of many suitable substrates. The substrate 102 is a silicon substrate, but may also be formed from glass, germanium, strained silicon, silicon-on-insulator. The substrate may be doped, with either p-type or n-type dopants. A target material layer 104 is shown over the substrate 102. In some embodiments additional material layers may be present between the target material layer 104 and the substrate 102. These additional material layers may be patterned prior to the deposition or formation of the target material layer 104. In the illustrated embodiment, the target material layer 104 is a dielectric material layer, such as an anti-reflection coating (ARC) layer. However, the target material layer 104 may be a conductive layer, such as a metal or doped polysilicon layer in some embodiments.

As illustrated in FIG. 1A, the wafer 100 further includes a patterned hardmask feature 106 over the target material layer 104. The patterned hardmask feature 106 is to be used in patterning the target material layer 104. The patterned hardmask feature 106 is a titanium nitride (TiN) hardmask formed by patterning a deposited layer of TiN. Some embodiments may include patterned hardmask features formed from other materials, such as tantalum nitride (TaN). FIG. 1A also depicts a patterning layer 108, which as illustrated is a photoresist (PR) layer 108 over the patterned hardmask feature 106 and the target material layer 104.

Figure 1B:
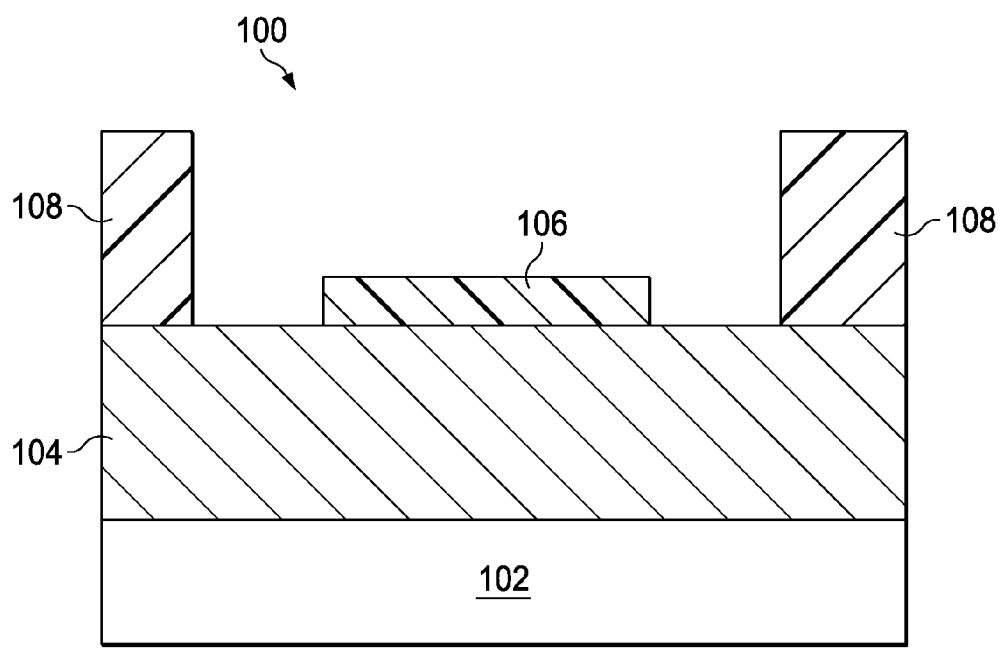

FIG. 1B also illustrated the wafer 100 of FIG. 1A. FIG. 1B is a fragmentary cross-section of the wafer 100 after a photolithographic process has been performed to selectively expose certain areas of the PR layer 108 to light of a given wavelength. The light provides energy to break or form chemical bonds depending on whether the PR is positive or negative photoresist. After the exposure, the wafer is chemically developed to remove the exposed portions of the PR layer 108. Alternatively, a negative photoresist may be used for the PR layer 108 in some embodiments. Only a portion of the patterned hardmask feature 106 may be exposed by the opening formed in the PR layer 108.

Referring now to FIGS. 2A, 2B, 2C, and 2D, depicted therein is a sequence of illustrations showing the wafer 100 undergoing an etch process 200. The etch process 200 is a reactive ion etch process. As illustrated, the etch process 200 includes a source or feed gas that includes a combination of gases. For example, the etch gases used in the etch process 200 may include a fluoride-containing main reactant gas such as a $CF_4$, $CHF_3$, $CH_2F_2$, $CH_3F$, $C_4F_8$, $NF_3$, or $SF_6$. The etch gases may further include assistant to the gases such as $N_2$, $H_2$, $CO$, $CO_2$, and $O_2$. Additionally, the etch gases may include carrier gas is such as Ar or He. As illustrated in FIGS. 2A, 2B, 2C, and 2D, a flow ratio of $H_2$ to the fluoride based main reactant gases is in a range from about 0 to about 2. Thus, for example where the etch gases used in etch process 200 include $CF_4$ at around 100 standard cubic centimeters per minute (sccm), the etch gas may include from about 0 sccm to about 200 sccm.

Figure 2A:
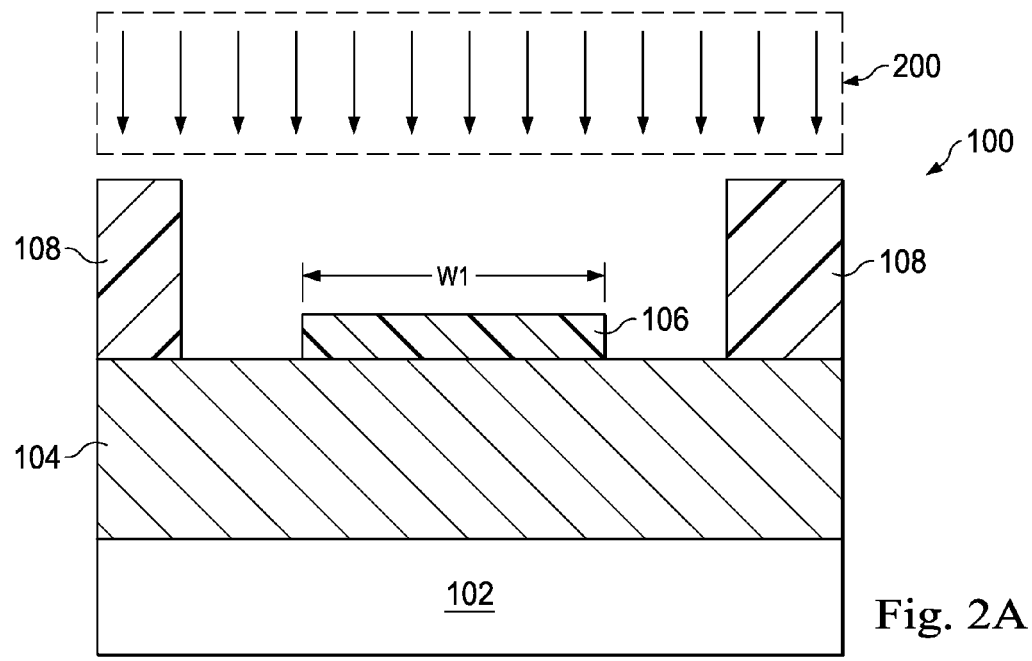
FIGS. 2A, 2B, 2C, and 2D are fragmentary views of the wafer of FIGS. 1A-B during processing.

At the commencement of the etch process 200, the patterned hardmask feature 106 has a first width labeled in FIG. 2A as W1. The width W1 may range from about 5 nanometers to more than 1 micron. As illustrated, the width W1 is about 40 nanometers.

Figure 2B:
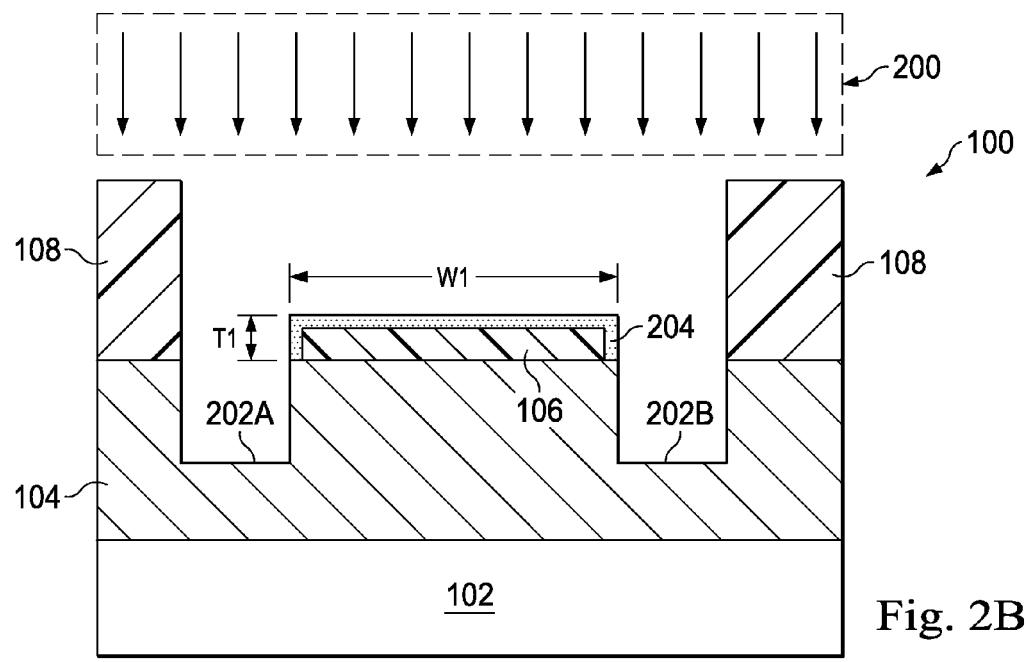

As the etch process 200 continues, material is removed from the exposed portions of the target material layer 104. The removal of the material generates an opening 202A and an opening 202B on either side of the patterned hardmask feature 106 as seen in FIG. 2B. Additionally as shown in FIG. 2B, as the etch process 200 progresses, the outer surface of the patterned hardmask feature 106 reacts with the fluoride-based reactant gases, converting the TiN into $TiF_x$, a different chemical compound. Thus, the patterned hardmask feature 106 develops an outer portion 204 having a different chemical makeup and behavior. Also, as shown in FIG. 2B, the patterned hardmask feature 106 has a thickness T1 early in the etch process 200.

Figure 2C:
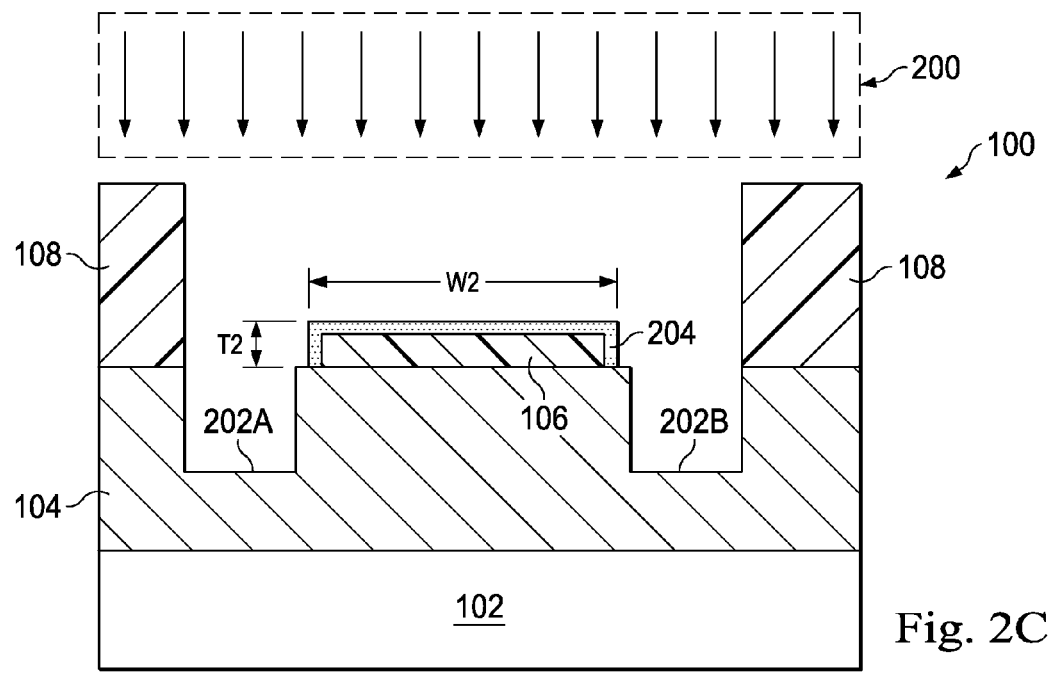

Referring now FIG. 2C, as shown therein the width of the patterned hardmask feature 106 changes during the etch process 200. Unlike the TiN of the patterned hardmask feature 106, the $TiF_x$ of the outer portion 204 is volatile. Thus, molecules of the $TiF_x$ outer portion 204 separate from the surface and are then removed from the etch chamber with exhaust gases. As this process continues, the dimensions of the patterned hardmask feature 106 change. Thus after some time passes in the etch process 200, the patterned hardmask feature 106 with its outer portion 204 no longer has width W1 and thickness T1, but has a lesser width W2 and a lesser thickness T2 as labeled in FIG. 2C.

Figure 2D:
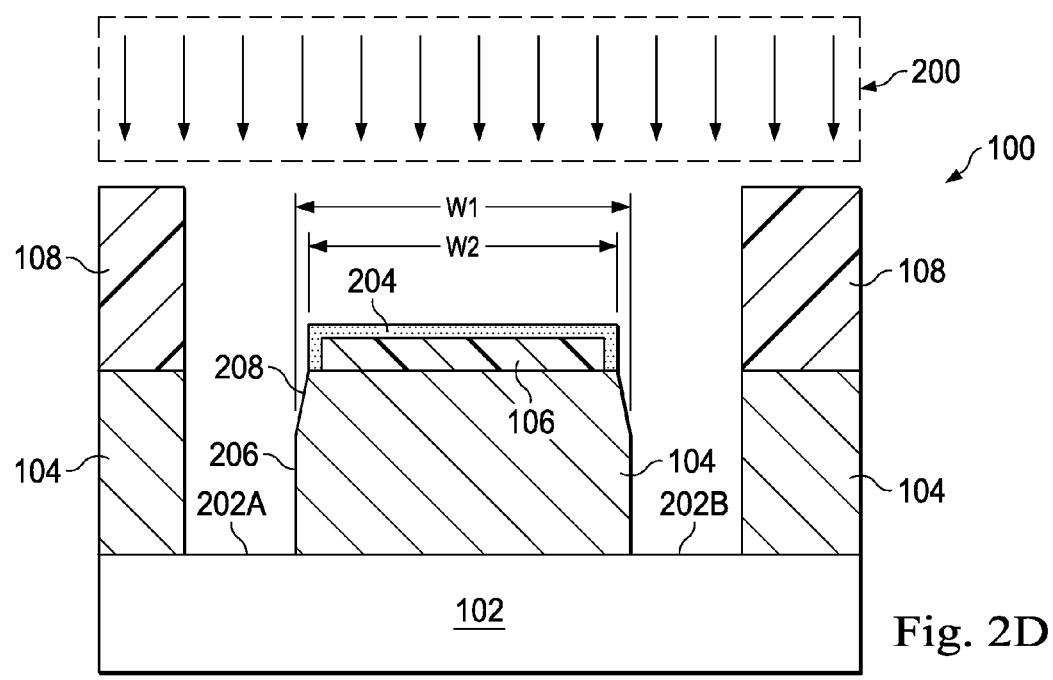

As the width and thickness of the patterned hardmask feature 106 decreases in size during the etch process 200, the profiles of the openings 202A and 202B are also changed. As seen in FIG. 2D, the opening 202A includes a substantially straight section 206 and a substantially tapered section 208. In some embodiments, the opening 208A may include only the tapered section 208. As the patterned hardmask feature 106 becomes thinner and smaller, the critical dimensions of features patterned into the target material layer 104 become more difficult to control and accurately reproduce.

Figure 3A:
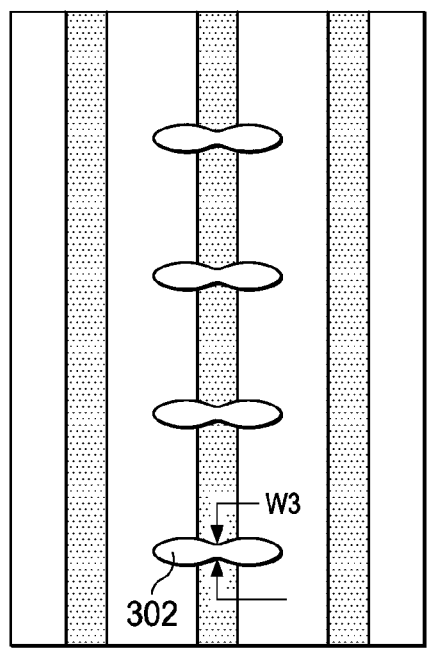
FIG. 3A is a top view of a simulated image of a plurality of exemplary hardmasks as processed in FIGS. 2A-D.
Figure 3B:
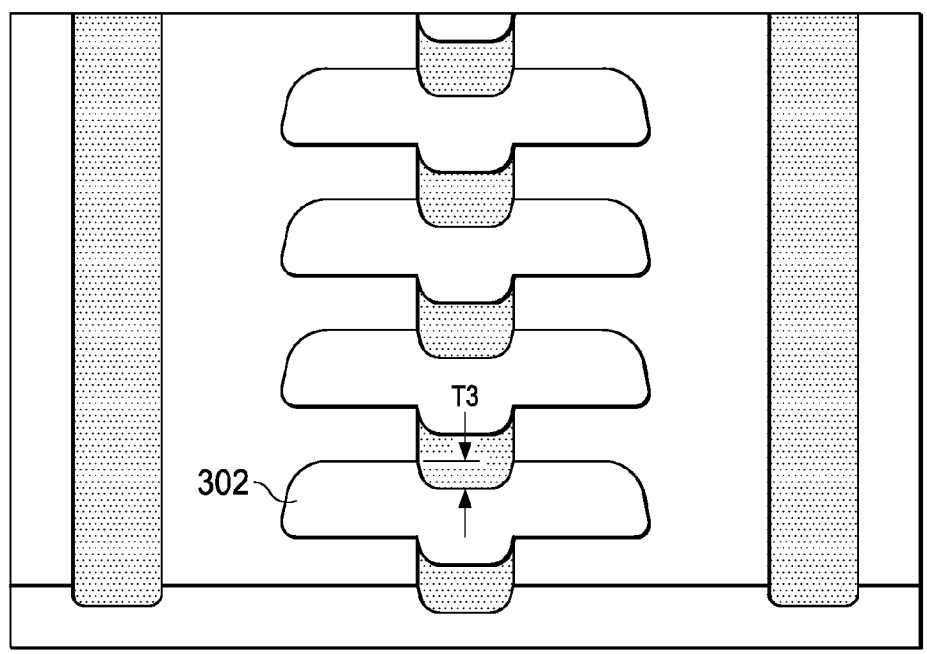
FIG. 3B is an off-axis view of the simulated image of the plurality of exemplary hardmasks of FIG. 3A.

Referring now to FIGS. 3A and 3B, shown therein are a top view (FIG. 3A) and an off-axis view (FIG. 3B) of a plurality of exemplary patterned hardmask features, like the patterned hardmask feature 106, as seen with the use of scanning electron microscopy (SEM). The exemplary patterned hardmask features include an exemplary feature 302. FIGS. 3A and 3B depicts the results of an etch process like the etch process 200 as described above in connection with FIGS. 2A-D. As seen in FIG. 3A, the etch process 200 has decreased the exemplary feature 302 to a width W3. And is seen in FIG. 3B, the etch process 200 has decreased a thickness T3 of the exemplary feature 302.

Figure 4A:
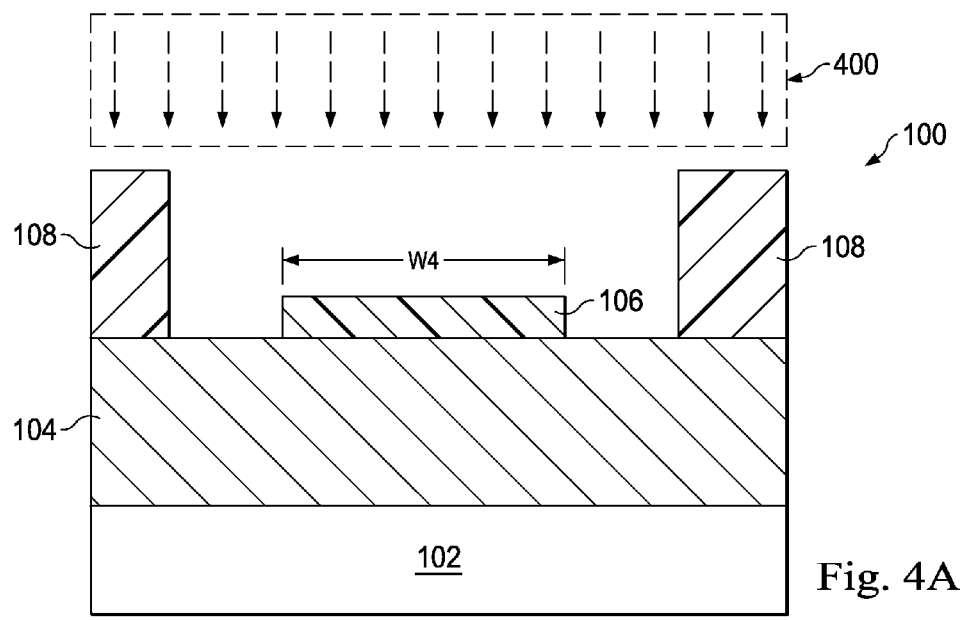
FIGS. 4A, 4B, 4C, and 4D are fragmentary views of the wafer of FIGS. 1A-B during processing according to an embodiment.
Figure 4B:
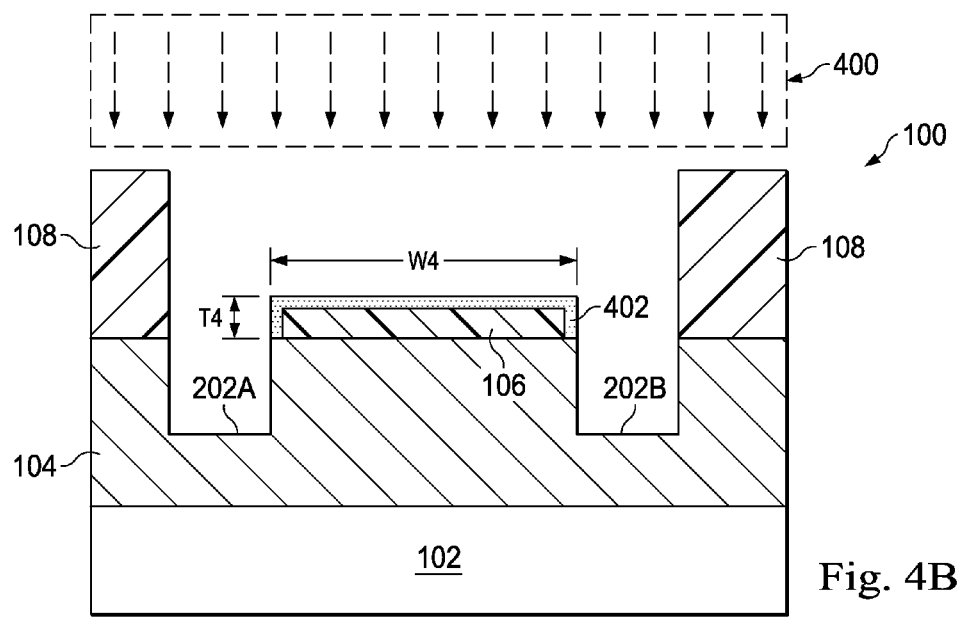

Referring now to FIGS. 4A-D, an etch process 400 and its results are depicted therein. The etch process 400 is similar to the etch process 200, but different in significant ways. The etch process 400 uses a flow of etch gases in a reactive ion etch process. The etch gases used in the etch process 200 may include a fluoride-containing main reactant gas such as a $CF_4$, $CHF_3$, $CH_2F_2$, $CH_3F$, $C_4F_8$, $NF_3$, or $SF_6$. The etch gases further includes assistant gases such as $N_2$, $H_2$, CO, $CO_2$, and $O_2$. Additionally, the etch gases may include a carrier gas is such as Ar or He. However, compared with the etch gases of etch process 200, the etch gases of etch process 400 are comparatively high in $H_2$ and in $N_2$. In the etch process 400, the etch gases include a flow ratio of $H_2$ to the fluoride-containing main reactant gas is in a range from about 2 to about 20, while a flow ratio of $N_2$ to $H_2$ is in a range from about 0.1 to about 10. As an example, the etch process 400 may include $CF_4$ at about 100 sccm, $H_2$ may range from 200 to 2000 sccm, while $N_2$ may range from 20 to 20,000 sccm. With flow ratios as described, the etch process 400 produces results that are different from those of the etch process 200. As seen in FIG. 4A, the patterned hardmask feature 106 has a width W4.

As was described above in connection with etch process 200, the fluoride-containing main reactant gas converts an outer portion 402 of the patterned hardmask feature 106 from TiN into $TiF_x$. Early in the etch process 400, the patterned hardmask feature 106, including the outer portion 402, has a width W4 and a thickness T4. As illustrated the thickness T4 is less than about 200 Angstroms thick. The openings 202A and 202B continue to deepen into the target material layer 104 as the etch process 400 continues.

Figure 4C:
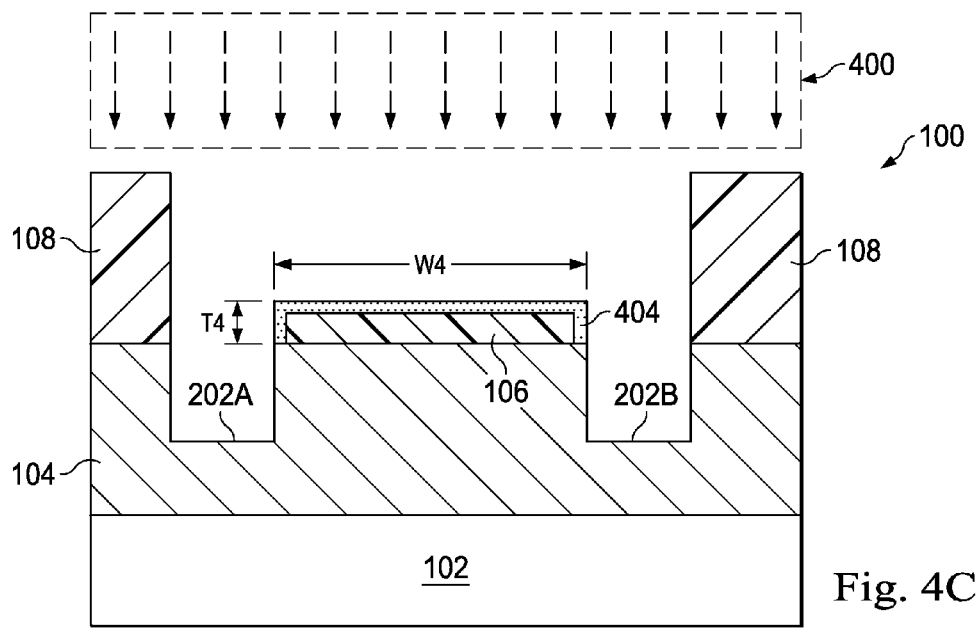

FIG. 4C includes an additional chemical process that occurs during the etch process 400. As the TiN of the patterned hardmask feature 106 is converted by the fluoride-containing main reactant gas into $TiF_x$, the high levels of $H_2$ in the etch gases promotes significant reaction with the $TiF_x$ to reduce the compound to T1. While the $TiF_x$ is volatile as described in FIGS. 2A-D, thus leading to a reduction in size and thickness of the patterned hardmask feature 106, the Ti is stable. The Ti is not removed from the etch chamber with the waste gases, but remains on the outer portion 404 of the patterned hardmask feature 106.

Figure 4D:
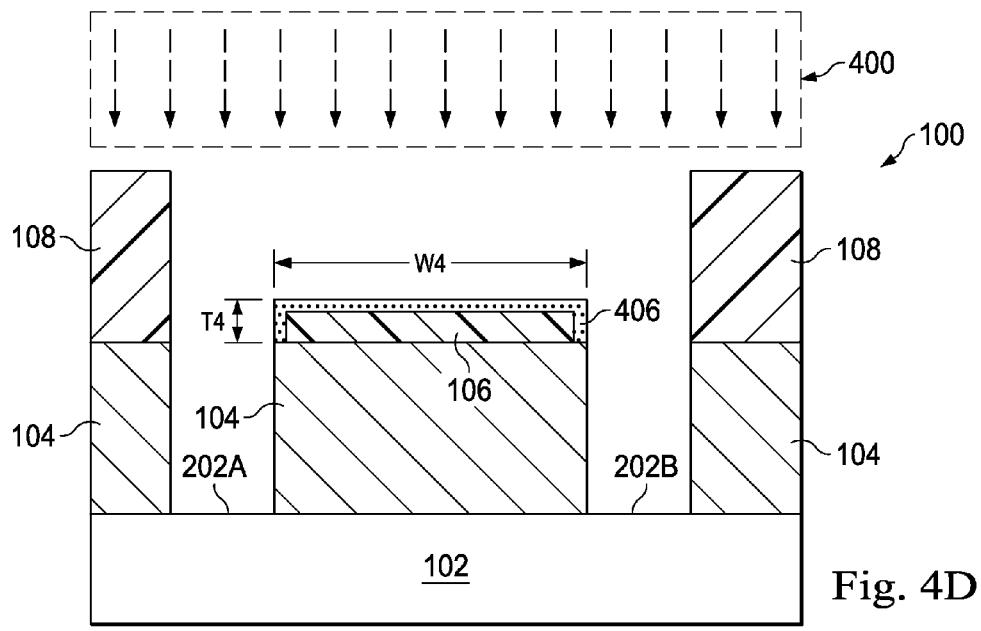

As shown in FIG. 4D, because of the high flow rate of $N_2$, the Ti is converted back into TiN, thereby forming the reconstituted outer portion 406. During the etch process 400, the reactions that first produce the $TiF_x$ from TiN, then the Ti from the $TiF_x$, and finally the TiN from the Ti, may be continuous and may occur at the same time, rather than in discrete stages as illustrated. Thus, as the $TiF_x$ is being formed on the outer portion of the patterned hardmask feature it is being converted into Ti and back into TiN. Because of the flow ratios of the etch gas used in the etch process 400, the rates of these reactions is such that it significantly decreases or prevents the decrease in thickness T4 and/or width W4 observed in FIGS. 3A and 3B. Because the thickness T4 and the width W4 remain substantially constant, or decrease significantly less than in the etch process 200, the profile of the openings 202A and 202B are not tapered as shown in FIG. 2D. Instead the profile is substantially straight.

Figure 5A:
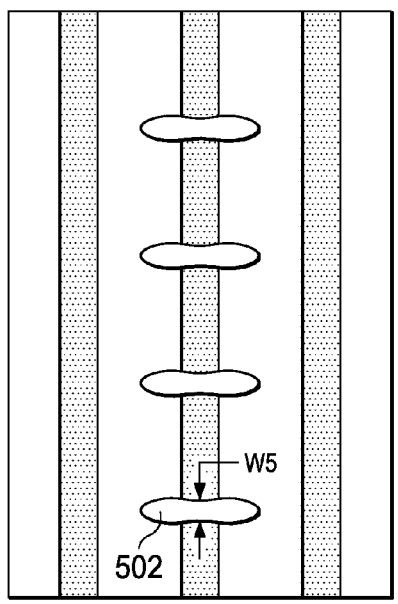
FIG. 5A is a top view of a simulated image of a plurality of exemplary hardmasks as processed in FIGS. 4A-D.
Figure 5B:
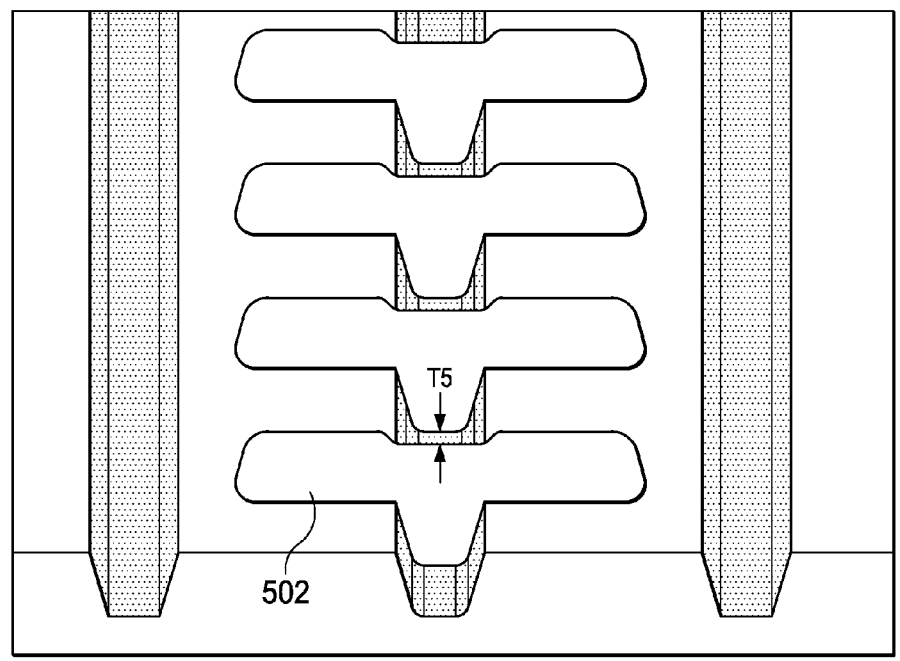
FIG. 5B is an off-axis view of the simulated image of the plurality of exemplary hardmasks of FIG. 5A.

Referring now to FIGS. 5A and 5B, shown therein are a top view (FIG. 5A) and an off-axis view (FIG. 5B) of a plurality of exemplary patterned hardmask features, like the patterned hardmask feature 106, as seen with the use of scanning electron microscopy (SEM). The exemplary patterned hardmask features include an exemplary feature 502. FIGS. 5A and 5B depict the results of an etch process like the etch process 400 as described above in connection with FIGS. 4A-D. As seen in FIG. 5A, the etch process 400 results in a width W5 of the exemplary feature 502. And is seen in FIG. 5B, the etch process 400 has decreased a thickness T5 of the exemplary feature 502. The change in the width of the exemplary feature and in the thickness are significantly less than observed in the SEM images of FIGS. 3A and 3B, which were produced by the etch process 200, rather than the etch process 400.

Figure 6:
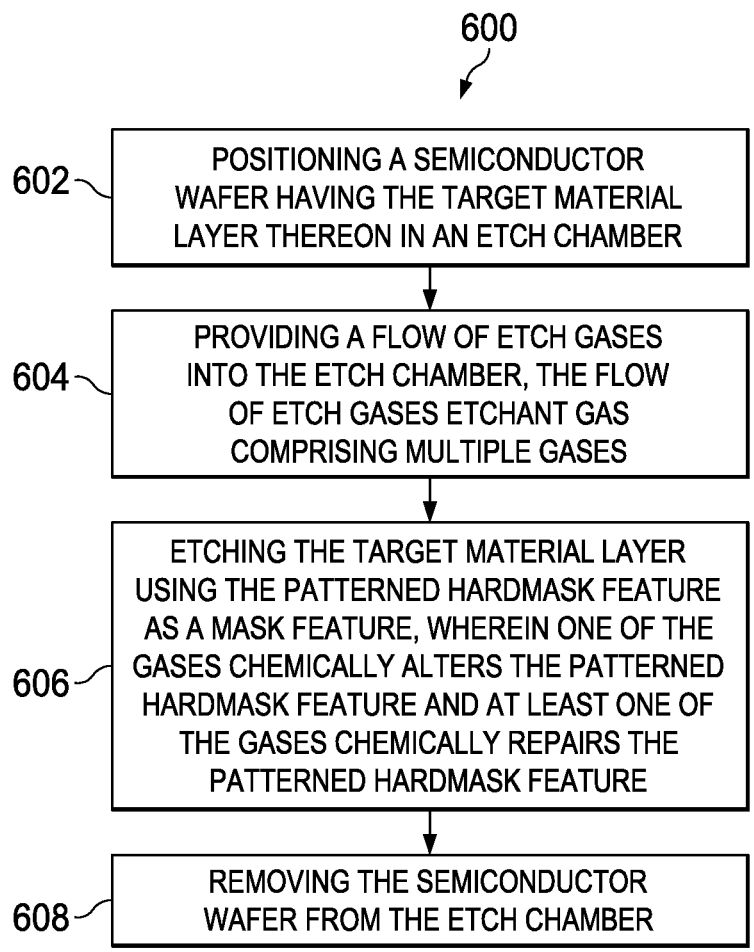
FIG. 6 is a flowchart of a method of patterning a target material layer on a semiconductor substrate according to an embodiment.

Referring now to FIG. 6, illustrated therein is a flowchart of a method 600 for patterning a target material layer. As illustrated in FIG. 6, the method 600 includes several enumerated steps. However, embodiments of the method 600 include additional steps before, after, in between, and/or as part of the enumerated steps. As illustrated, the method 600 includes a step 602 in which a semiconductor wafer having the target material layer thereon is positioned within an etch chamber. The semiconductor wafer has a patterned hardmask feature formed from a compound on the target material layer. In step 604, a flow of etch gases is provided into the etch chamber. The flow of etch gases includes a plurality of gases. In step 606, the target material layer is etched using the patterned hardmask feature as a mask feature. During the etching, one of the gases chemically alters the patterned hardmask feature, and at least one of the gases chemically repairs the patterned hardmask feature so that the patterned hardmask feature retains its dimensions during the etching. And in step 608, the semiconductor wafer is removed from the etch chamber.

To more clearly describe an embodiment of the method 600, reference is now made to the etch process 400 as illustrated in FIGS. 4A-D. The wafer 100 is inserted into a reactive ion etch chamber or other etch chamber in which the etch process 400 is performed (step 602). The etch chamber includes reactant and assistive gas inlets and exhaust or waste gas outlets. Additionally, the etch chamber has sources of radio frequency and/or direct current power to produce a plasma within the etch chamber. When the wafer 100 is inserted into the etch chamber 400, the patterned hardmask feature 106 has a width W4.

The etch process 400 is performed in the etch chamber by providing a flow of etch gases into the chamber and a flow of waste gases from the chamber. The etch gases used in the etch gas process include a chemical that damages the surface of the patterned hardmask feature, such as a fluoride-based main reactant gas like $CF_4$ that converts some of the TiN of the hardmask feature 106 into $TiF_x$. The etch gases further include chemicals that repair the patterned hardmask feature 106, including a high level of $H_2$ to convert the $TiF_x$ into Ti before it volatilizes, removing material from the patterned hardmask feature 106. The etch gases also include a high level of $N_2$, which converts the Ti into TiN, thereby repairing the hardmask feature 106. The gases are used in a reactive ion etch to etch exposed portions of the target material layer 104, thereby exposing an underlying surface, such as that of the substrate 102 (steps 604 and 606). In some embodiments of the method 600, the etch process includes a $C_xF_y$ reactant gas, $H_2$ in a flow ratio of $H_2$ to $C_xF_y$ reactant gas of about 2 to about 20, and $N_2$ in a flow ratio of $N_2$ to $H_2$ of about 0.1 to about 10. In some embodiments, the flow ratio of $H_2$ to $C_xF_y$ reactant gas is from about 10 to about 20 and the flow ratio of $N_2$ to $H_2$ of about 5 to about 10.

After the etch process 400 is performed, and the surface below the patterned hardmask feature 106, with an outer portion (402, 404, and 406) having undergone damage and repair during the etch process, the wafer 100 is removed from the etch chamber (608). Before the wafer is finished it may be subjected to further patterning processes, diced, and packaged. Other features discussed above in connection with the etch process 400 as shown in FIGS. 4A-D may be performed as part of the method 600 of FIG. 6.

The methods and features described above permit the use of thinner hardmask features to pattern underlying layers. The combination of etch gases as described provides for the in situ repair and maintenance of the hardmask feature so that it does not decrease in size. By preventing or inhibiting the loss of material from the hardmask feature using as an etch mask in a etch process, the profile of features formed during the etch is improved, with the profile being in a range from about 85 to 90 degrees. Additionally, critical dimensions can be maintained by the hardmask in such an etch process.

In one exemplary aspect, the present disclosure describes a method of patterning a target material layer. The method includes steps of positioning a semiconductor wafer having the target material layer thereon in an etch chamber and of providing a flow of etch gases into the etch chamber, the flow of etch gases etchant gas comprising a plurality of gases. The semiconductor wafer has a patterned hardmask feature formed from a compound on the target material layer. The method also includes steps of etching the target material layer using the patterned hardmask feature as a mask feature, wherein one of the gases chemically alters the patterned hardmask feature and at least one of the gases chemically repairs the patterned hardmask feature so that the patterned hardmask feature retains its dimensions during the etching.

In another exemplary aspect, another method of patterning a target material layer is disclosed herein. The method comprises steps of positioning a semiconductor wafer having the target material layer thereon in an etch chamber and of providing a flow of etch gases into the etch chamber. The semiconductor wafer having a patterned hardmask feature formed from a compound on the target material layer. The method also includes steps of etching the target material layer with an etch gas using the patterned hardmask feature as a mask feature and of removing the semiconductor wafer from the etch chamber when the etch process is completed. The etch gas comprises includes a $C_xF_y$ reactant gas, $H_2$ in a flow ratio of $H_2$ to $C_xF_y$ reactant gas of about 2 to about 20, and $N_2$ in a flow ratio of $N_2$ to $H_2$ of about 0.1 to about 10.

In an additional exemplary aspect, a patterned semiconductor wafer is disclosed. The patterned semiconductor wafer includes a semiconductor substrate having a plurality of layers thereon with a target material layer included in the plurality of layers on the semiconductor substrate. The target material layer has at least one opening therein that exposes a surface below the target material layer. The patterned semiconductor wafer also includes a patterned hardmask feature that is formed from a compound and includes a reconstituted outer portion. The reconstituted outer portion being reconstituted during an etch process.

The embodiments presented by the top view and cross-sectional view figures described above are not exhaustive. Some processes discuss in any given embodiment may be performed in different orders or have additional processes between the steps. For example, one etch process may be used to remove multiple layers even where more than one is discussed. Thus, the examples provided above are exemplary. They are not intended to be limiting. One skilled in the art may readily devise other systems and methods consistent with the disclosed embodiments. These other systems and methods are intended to be within the scope of this disclosure. As such, the disclosure is limited only by the following claims.

What is claimed is:

1. A method of patterning a device, the method comprising:

forming a patterned mask feature over a target material layer of the device;

providing the device with the patterned mask feature over the target material layer to an etch chamber;

providing a plurality of gases to the etch chamber;

etching the target material layer using the patterned mask feature, wherein at least one of the gases performs a first effect on a dimension of the patterned mask feature and at least another of the gases performs a second effect on the dimension of the patterned mask feature, so that the dimension is substantially the same before and after the etching, wherein etching the target material layer includes converting $TiF_x$ to Ti and converting T to TiN; and after etching, removing the device from the etch chamber.

2. The method of claim 1, wherein the patterned mask feature comprises TiN.

3. The method of claim 1, wherein a width of the patterned mask feature remains constant during the etch process.

4. The method of claim 1, wherein a thickness of the patterned mask feature remains constant during the etch process.

5. The method of claim 1, wherein the plurality of gases include $C_xF_y$, $H_2$, and $N_2$.

6. The method of claim 5, wherein a flow ratio of $H_2$ to $C_xF_y$ is greater than 2 and a flow ratio of $N_2$ to $H_2$ is greater than 0.1.

7. The method of claim 5, wherein the $C_xF_y$ converts portions of the patterned mask feature to $TiF_x$, and the $H_2$ and $N_2$ convert the $TiF_x$ into TiN.

8. The method of claim 1, further comprising:
depositing a layer of photoresist over the device; and
patterning the photoresist layer to expose a portion of the patterned mask feature and a portion of the target material layer.

9. A method of patterning a target material layer, the method comprising:
positioning a device having the target material layer thereon in an etch chamber, the device having a patterned mask feature formed from a compound on the target material layer;
providing a flow of etch gases into the etch chamber;
etching the target material layer with the etch gases using the patterned mask feature as a mask feature, wherein the etch gases comprise a $C_xF_y$ reactant gas, wherein etching the target material layer with the etch gases includes converting $TiF_x$ to Ti and converting Ti to TiN; and
removing the device from the etch chamber.

10. The method of claim 9, wherein the patterned mask feature comprises TiN.

11. The method of claim 9, wherein the converting the $TiF_x$ to Ti and converting Ti to TiN occurs at a rate that is at least as high as a rate of converting TiN to $TiF_x$.

12. The method of claim 9, wherein the etch gases further comprise:
$H_2$ in a flow ratio of $H_2$ to $C_xF_y$ reactant gas of about 2 to about 20; and
$N_2$ in a flow ratio of $N_2$ to $H_2$ of about 0.1 to about 10.

13. A method of patterning a target material layer, the method comprising:
positioning a semiconductor wafer having the target material layer thereon in an etch chamber, the semiconductor wafer having a patterned hardmask feature formed from a compound on the target material layer;
providing a flow of etch gases into the etch chamber;
etching the target material layer with the etch gases using the patterned hardmask feature as a mask feature, wherein the etch gases comprise a $C_xF_y$ reactant gas; and
removing the semiconductor wafer from the etch chamber, and
wherein the patterned mask feature is formed of a first material prior to etching the target material layer with the etch gases using the patterned hardmask feature,
wherein etching the target material layer with the etch gases using the patterned hardmask feature as the mask feature includes:
applying at least a first gas from the etch gases to the patterned hardmask feature to convert the first material into a second material such that at least a portion of the patterned hardmask feature is formed of the second material, the second material being different from the first material; and
applying at least a second gas from the etch gases to the portion of the patterned hardmask feature that is formed of the second material to convert the second material back into the first material.

14. The method of claim 13, wherein the patterned hardmask feature comprises TiN.

15. The method of claim 14, wherein the etch gases further comprise:
$H_2$ in a flow ratio of $H_2$ to $C_xF_y$ reactant gas of about 2 to about 20; and
$N_2$ in a flow ratio of $N_2$ to $H_2$ of about 0.1 to about 10.

16. The method of claim 15, wherein the etching the target material layer with the etch gases comprises:
converting $TiF_x$ to Ti; and
converting Ti to TiN.

17. The method of claim 16, wherein the converting the $TiF_x$ to Ti and converting Ti to TiN occurs at a rate that is at least as high as a rate of converting TiN to $TiF_x$.

18. The method of claim 13, wherein a width of the patterned mask feature remains constant during the etch process.

19. The method of claim 13, wherein a thickness of the patterned mask feature remains constant during the etch process.

20. The method of claim 13, wherein etching the target material layer with the etch gases includes converting $TiF_x$ to Ti and converting Ti to TiN.

* * * * *